(12) United States Patent
Tajalli

(10) Patent No.: US 10,673,608 B2
(45) Date of Patent: Jun. 2, 2020

(54) SAMPLER WITH LOW INPUT KICKBACK

(71) Applicant: Kandou Labs, S.A., Lausanne (CH)

(72) Inventor: Armin Tajalli, Salt Lake City, UT (US)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 16/405,769

(22) Filed: May 7, 2019

(65) Prior Publication Data

US 2019/0268133 A1  Aug. 29, 2019

Related U.S. Application Data

(63) Continuation of application No. 16/012,646, filed on Jun. 19, 2018, now Pat. No. 10,284,362, which is a
(Continued)

(51) Int. Cl.
*H04L 7/00* (2006.01)
*H03L 7/08* (2006.01)
(Continued)

(52) U.S. Cl.
CPC ........... *H04L 7/0087* (2013.01); *H03K 5/135* (2013.01); *H03L 7/0807* (2013.01);
(Continued)

(58) Field of Classification Search
CPC ... H04L 7/0087; H04L 7/0331; H04L 7/0045; H04L 7/033; H03L 7/0807; H03K 5/135
See application file for complete search history.

(56) References Cited

U.S. PATENT DOCUMENTS 3,636,463 A   1/1972 Ongkiehong
3,824,494 A   7/1974 Wilcox
(Continued)

FOREIGN PATENT DOCUMENTS

WO   2018052657 A1   3/2018

OTHER PUBLICATIONS

Kim, Kyu-Young , et al., "8 mW 1.65-Gbps continuous-time equalizer with clock attenuation detection for digital display interface", Analog Integrated Circuits and Signal Processing, Kluwer Academic Publishers, vol. 63, No. 2, Oct. 11, 2009, 329-337 (9 pages).
(Continued)

*Primary Examiner* — Dac V Ha
(74) *Attorney, Agent, or Firm* — Invention Mine LLC

(57) ABSTRACT

Methods and systems are described for receiving a signal to be sampled and responsively generating, at a pair of common nodes, a differential current representative of the received signal, receiving a plurality of sampling interval signals, each sampling interval signal received at a corresponding sampling phase of a plurality of sampling phases, for each sampling phase, pre-charging a corresponding pair of output nodes using a pre-charging FET pair receiving the sampling interval signal, forming a differential output voltage by discharging the corresponding pair of output nodes via a discharging FET pair connected to the pair of common nodes, the FET pair receiving the sampling interval signal and selectively enabling the differential current to discharge the corresponding pair of output nodes, and latching the differential output voltage.

20 Claims, 9 Drawing Sheets

Related U.S. Application Data continuation of application No. 15/494,436, filed on Apr. 21, 2017, now Pat. No. 10,003,454.

(60) Provisional application No. 62/326,596, filed on Apr. 22, 2016.

(51) Int. Cl.
*H04L 7/033* (2006.01)
*H03K 5/135* (2006.01)

(52) U.S. Cl.
CPC .......... *H04L 7/0045* (2013.01); *H04L 7/0331* (2013.01); *H04L 7/033* (2013.01)

(56) References Cited

U.S. PATENT DOCUMENTS

| | | |
|---|---|---|
| 3,939,468 A | 2/1976 | Mastin |
| 4,276,543 A | 6/1981 | Miller et al. |
| 4,774,498 A | 9/1988 | Traa |
| 4,897,657 A | 1/1990 | Brubaker |
| 5,017,924 A | 5/1991 | Guiberteau et al. |
| 5,459,465 A | 10/1995 | Kagey |
| 5,510,736 A | 4/1996 | Van |
| 5,748,948 A | 5/1998 | Yu et al. |
| 5,793,254 A | 8/1998 | OConnor |
| 5,945,935 A | 8/1999 | Kusumoto et al. |
| 6,226,330 B1 | 5/2001 | Mansur |
| 6,232,908 B1 | 5/2001 | Nakaigawa |
| 6,346,907 B1 | 2/2002 | Dacy et al. |
| 6,384,758 B1 | 5/2002 | Michalski et al. |
| 6,396,329 B1 | 5/2002 | Zerbe |
| 6,400,302 B1 | 6/2002 | Amazeen et al. |
| 6,462,584 B1 | 10/2002 | Proebsting |
| 6,563,382 B1 | 5/2003 | Yang |
| 6,624,699 B2 | 9/2003 | Yin et al. |
| 6,839,587 B2 | 1/2005 | Yonce |
| 6,879,816 B2 | 4/2005 | Bult et al. |
| 6,888,483 B2 | 5/2005 | Mulder |
| 6,972,701 B2 | 12/2005 | Jansson |
| 7,075,996 B2 | 7/2006 | Simon et al. |
| 7,167,523 B2 | 1/2007 | Mansur |
| 7,188,199 B2 | 3/2007 | Leung et al. |
| 7,199,728 B2 | 4/2007 | Dally et al. |
| 7,269,212 B1 | 9/2007 | Chau et al. |
| 7,372,295 B1 | 5/2008 | Wei |
| 7,372,390 B2 | 5/2008 | Yamada |
| 7,397,302 B2 | 7/2008 | Bardsley et al. |
| 7,528,758 B2 | 5/2009 | Ishii |
| 7,656,321 B2 | 2/2010 | Wang |
| 7,683,720 B1 | 3/2010 | Yehui et al. |
| 7,688,102 B2 | 3/2010 | Bae et al. |
| 7,697,915 B2 | 4/2010 | Behzad et al. |
| 7,804,361 B2 | 9/2010 | Lim et al. |
| 7,957,472 B2 | 6/2011 | Wu et al. |
| 8,000,664 B2 | 8/2011 | Khorram |
| 8,030,999 B2 | 10/2011 | Chatterjee et al. |
| 8,106,806 B2 | 1/2012 | Toyomura et al. |
| 8,159,375 B2 | 4/2012 | Abbasfar |
| 8,159,376 B2 | 4/2012 | Abbasfar |
| 8,183,930 B2 | 5/2012 | Kawakami et al. |
| 8,547,272 B2 | 10/2013 | Nestler et al. |
| 8,581,824 B2 | 11/2013 | Baek et al. |
| 8,604,879 B2 | 12/2013 | Mourant et al. |
| 8,643,437 B2 | 2/2014 | Chiu et al. |
| 8,674,861 B2 | 3/2014 | Matsuno et al. |
| 8,687,968 B2 | 4/2014 | Nosaka et al. |
| 8,791,735 B1 | 7/2014 | Shibasaki |
| 8,841,936 B2 | 9/2014 | Nakamura |
| 8,860,590 B2 | 10/2014 | Yamagata et al. |
| 9,069,995 B1 | 6/2015 | Cronie |
| 9,106,465 B2 | 8/2015 | Walter |
| 9,148,087 B1 | 9/2015 | Tajalli |
| 9,178,503 B2 | 11/2015 | Hsieh |
| 9,281,785 B2 | 3/2016 | Sjöland |
| 9,292,716 B2 | 3/2016 | Winoto et al. |
| 9,300,503 B1 | 3/2016 | Holden et al. |
| 10,003,315 B2 | 6/2018 | Tajalli |
| 2001/0006538 A1 | 7/2001 | Simon et al. |
| 2002/0050861 A1 | 5/2002 | Nguyen et al. |
| 2002/0149508 A1 | 10/2002 | Hamashita |
| 2002/0158789 A1 | 10/2002 | Yoshioka et al. |
| 2002/0174373 A1 | 11/2002 | Chang |
| 2003/0016763 A1 | 1/2003 | Doi et al. |
| 2003/0085763 A1 | 5/2003 | Schrodinger et al. |
| 2003/0132791 A1* | 7/2003 | Hsieh .................. G06F 9/3869 327/218 |
| 2003/0160749 A1 | 8/2003 | Tsuchi |
| 2003/0174023 A1 | 9/2003 | Miyasita |
| 2003/0184459 A1 | 10/2003 | Engl |
| 2003/0218558 A1 | 11/2003 | Mulder |
| 2004/0027185 A1 | 2/2004 | Fiedler |
| 2004/0169529 A1 | 9/2004 | Afghani et al. |
| 2005/0057379 A1 | 3/2005 | Jansson |
| 2005/0270098 A1 | 12/2005 | Zhang et al. |
| 2006/0036668 A1 | 2/2006 | Jaussi et al. |
| 2006/0097786 A1 | 5/2006 | Su et al. |
| 2006/0103463 A1 | 5/2006 | Lee et al. |
| 2006/0192598 A1 | 8/2006 | Baird et al. |
| 2006/0194598 A1 | 8/2006 | Kim et al. |
| 2007/0009018 A1 | 1/2007 | Wang |
| 2007/0176708 A1 | 8/2007 | Otsuka et al. |
| 2007/0182487 A1 | 8/2007 | Ozasa et al. |
| 2007/0188367 A1 | 8/2007 | Yamada |
| 2007/0201546 A1 | 8/2007 | Lee |
| 2008/0001626 A1 | 1/2008 | Bae et al. |
| 2008/0187037 A1 | 8/2008 | Bulzacchelli et al. |
| 2009/0090333 A1 | 4/2009 | Spadafora et al. |
| 2009/0115523 A1 | 5/2009 | Akizuki et al. |
| 2009/0323864 A1 | 12/2009 | Tired |
| 2010/0148819 A1 | 6/2010 | Bae et al. |
| 2010/0156691 A1 | 6/2010 | Taft |
| 2010/0219781 A1 | 9/2010 | Kuwamura |
| 2010/0235673 A1 | 9/2010 | Abbasfar |
| 2010/0271107 A1 | 10/2010 | Tran et al. |
| 2011/0028089 A1 | 2/2011 | Komori |
| 2011/0032977 A1 | 2/2011 | Hsiao et al. |
| 2011/0051854 A1 | 3/2011 | Kizer et al. |
| 2011/0057727 A1 | 3/2011 | Cranford et al. |
| 2011/0096054 A1 | 4/2011 | Cho et al. |
| 2011/0103508 A1 | 5/2011 | Mu et al. |
| 2011/0133816 A1 | 6/2011 | Wu et al. |
| 2011/0156819 A1* | 6/2011 | Kim .................. H02M 3/07 330/296 |
| 2012/0025911 A1 | 2/2012 | Zhao et al. |
| 2012/0044021 A1 | 2/2012 | Yeh et al. |
| 2012/0133438 A1 | 5/2012 | Tsuchi et al. |
| 2013/0106513 A1 | 5/2013 | Cyrusian et al. |
| 2013/0114663 A1 | 5/2013 | Ding et al. |
| 2013/0147553 A1 | 6/2013 | Iwamoto |
| 2013/0195155 A1 | 8/2013 | Pan et al. |
| 2013/0215954 A1 | 8/2013 | Beukema et al. |
| 2013/0259113 A1 | 10/2013 | Kumar |
| 2013/0334985 A1 | 12/2013 | Kim et al. |
| 2014/0119479 A1 | 5/2014 | Tajalli |
| 2014/0176354 A1* | 6/2014 | Yang .................. G11C 27/024 341/122 |
| 2014/0177696 A1 | 6/2014 | Hwang |
| 2014/0203794 A1 | 7/2014 | Pietri et al. |
| 2014/0266440 A1 | 9/2014 | Itagaki et al. |
| 2014/0312876 A1 | 10/2014 | Hanson et al. |
| 2015/0070201 A1 | 3/2015 | Dedic et al. |
| 2015/0146771 A1 | 5/2015 | Walter |
| 2015/0198647 A1 | 7/2015 | Atwood et al. |
| 2016/0013954 A1 | 1/2016 | Shokrollahi et al. |
| 2016/0197747 A1 | 7/2016 | Ulrich et al. |
| 2017/0085239 A1 | 3/2017 | Yuan et al. |
| 2017/0104458 A1 | 4/2017 | Cohen et al. |
| 2017/0214374 A1 | 7/2017 | Tajalli |
| 2019/0199557 A1 | 6/2019 | Taylor et al. |

(56) References Cited

OTHER PUBLICATIONS

Takahashi, Masayoshi, et al., "A 2-GHz Gain Equalizer for Analog Signal Transmission Using Feedforward Compensation by a Low-Pass Filter", IEICE Transactions on Fundamentals of Electronics, vol. E94A, No. 2, Feb. 2011, 611-616 (6 pages).
Wang, Hui, et al., "Equalization Techniques for High-Speed Serial Interconnect Transceivers", Solid-State and Integrated-Circuit Technology, 9th International Conference on ICSICT, Piscataway, NJ, Oct. 20, 2008, 1-4 (4 pages).
Anadigm, "Using the Anadigm Multiplier CAM", Design Brief 208, www.anadigm.com, Copyright 2002, 2002, (6 pages).
Schneider, J., et al., "ELEC301 Project: Building an Analog Computer", http://www.clear.rice.edu/elec301/Projects99/anlgcomp/, Dec. 19, 1999, (9 pages).
Tierney, J., "A Digital Frequency Synthesizer", Audio and Electroacoustics, IEEE Transactions, pp. 48-57, vol. 19, No. 1, Abstract, Mar. 1971, (1 page).
Palmisano, G., et al., "A Replica Biasing for Constant-Gain CMOS Open-Loop Amplifiers", Circuits and Systems, IEEE International Symposium in Monterey, CA, May 31, 1998, 363-366 (4 pages).

\* cited by examiner

SAMPLER WITH LOW INPUT KICKBACK

CROSS REFERENCE TO RELATED APPLICATIONS

This application is a continuation of U.S. application Ser. No. 16/012,646, filed Jun. 19, 2018, entitled "Sampler with Low Input Kickback", naming Armin Tajalli, which is a continuation of U.S. application Ser. No. 15/494,436, filed Apr. 21, 2017, naming Armin Tajalli, entitled "Sampler with Low Input Kickback", which claims the benefit of U.S. Provisional Application No. 62/326,596, filed Apr. 22, 2016, naming Armin Tajalli, entitled "Sampler with Low Input Kickback", all of which are hereby incorporated herein by reference in their entirety for all purposes.

REFERENCES

The following prior applications are herein incorporated by reference in their entirety for all purposes:

U.S. Patent Publication 2011/0268225 of Application 12/784,414, filed May 20, 2010, naming Harm Cronie and Amin Shokrollahi, entitled "Orthogonal Differential Vector Signaling" (hereinafter "Cronie I").

U.S. Patent Publication 2011/0302478 of Application 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II").

U.S. patent application Ser. No. 13/542,599, filed Jul. 5, 2012, naming Armin Tajalli, Harm Cronie, and Amin Shokrollahi entitled "Methods and Circuits for Efficient Processing and Detection of Balanced Codes" (hereafter called "Tajalli I".)

U.S. patent application Ser. No. 13/842,740, filed Mar. 15, 2013, naming Brian Holden, Amin Shokrollahi and Anant Singh, entitled "Methods and Systems for Skew Tolerance in and Advanced Detectors for Vector Signaling Codes for Chip-to-Chip Communication", hereinafter identified as [Holden I];

U.S. Provisional Patent Application No. 61/946,574, filed Feb. 28, 2014, naming Amin Shokrollahi, Brian Holden, and Richard Simpson, entitled "Clock Embedded Vector Signaling Codes", hereinafter identified as [Shokrollahi I].

U.S. patent application Ser. No. 14/612,241, filed Aug. 4, 2015, naming Amin Shokrollahi, Ali Hormati, and Roger Ulrich, entitled "Method and Apparatus for Low Power Chip-to-Chip Communications with Constrained ISI Ratio", hereinafter identified as [Shokrollahi II].

U.S. patent application Ser. No. 13/895,206, filed May 15, 2013, naming Roger Ulrich and Peter Hunt, entitled "Circuits for Efficient Detection of Vector Signaling Codes for Chip-to-Chip Communications using Sums of Differences", hereinafter identified as [Ulrich I].

U.S. patent application Ser. No. 14/816,896, filed Aug. 3, 2015, naming Brian Holden and Amin Shokrollahi, entitled "Orthogonal Differential Vector Signaling Codes with Embedded Clock", hereinafter identified as [Holden II].

U.S. patent application Ser. No. 14/926,958, filed Oct. 29, 2015, naming Richard Simpson, Andrew Stewart, and Ali Hormati, entitled "Clock Data Alignment System for Vector Signaling Code Communications Link", hereinafter identified as [Stewart I].

U.S. patent application Ser. No. 14/925,686, filed Oct. 28, 2015, naming Armin Tajalli, entitled "Advanced Phase Interpolator", hereinafter identified as [Tajalli II].

U.S. Provisional Patent Application No. 62/286,717, filed Jan. 25, 2016, naming Armin Tajalli, entitled "Voltage Sampler Driver with Enhanced High-Frequency Gain", hereinafter identified as [Tajalli III].

FIELD OF THE INVENTION

The present embodiments relate to communications systems circuits generally, and more particularly to obtaining an instantaneous measurement of a received signal voltage relative to a provided clock signal, as one component of detecting received communications signals from a high-speed multi-wire interface used for chip-to-chip communication.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device is sampled (or their signal value otherwise recorded) at intervals best representing the original transmitted values, regardless of transmission channel delays, interference, and noise. The timing of this sampling or slicing operation is controlled by an associated Clock and Data Recovery (CDR) timing system, which determines the appropriate sample timing.

BRIEF DESCRIPTION

To reliably detect the data values transmitted over a communications system, a receiver accurately measures the received signal value amplitudes at carefully selected times. In some embodiments, the value of the received signal is first captured at the selected time using a known sample-and-hold or track-and-hold circuit (or known variants such as amplify-and-hold or integrate-and-hold), and then the resulting value is measured against one or more reference values using a known voltage comparator circuit. Other embodiments first use a comparator to "slice" the analog signal and obtain a digital result, then digitally sample the resulting binary value using a clocked digital latch. Further embodiments utilize circuits configured to apply both the time- and amplitude-domain constraints, producing a result that represents the input value at a particular time and relative to a provided reference level.

In many embodiments, a received signal source may be measured by multiple sampling circuits, either to facilitate data reception at rates greater than a single data processing system can sustain (so-called multiphase receiver architectures), or to support ancillary functions such as clock synchronization, test/diagnostic support, etc. In these embodiments, energy leakage such as from clock switching within one sampler may appear as transients at the sampler input (herein described as "kickback"), which may then perturb other sampler measurements of the common input signal. Sampler embodiments are described which produce extremely low levels of kickback energy, making them particularly desirable in such applications.

Methods and systems are described for receiving a signal to be sampled and responsively generating, at a pair of common nodes, a differential current representative of the received signal, receiving a plurality of sampling interval signals, each sampling interval signal received at a corresponding sampling phase of a plurality of sampling phases, for each sampling phase, pre-charging a corresponding pair of output nodes using a pre-charging field-effect transistor (FET) pair receiving the sampling interval signal, forming a differential output voltage by discharging the corresponding pair of output nodes via a discharging FET pair connected to the pair of common nodes, the FET pair receiving the sampling interval signal and selectively enabling the differential current to discharge the corresponding pair of output nodes, and latching the differential output voltage.

DETAILED DESCRIPTION

Figure 1:
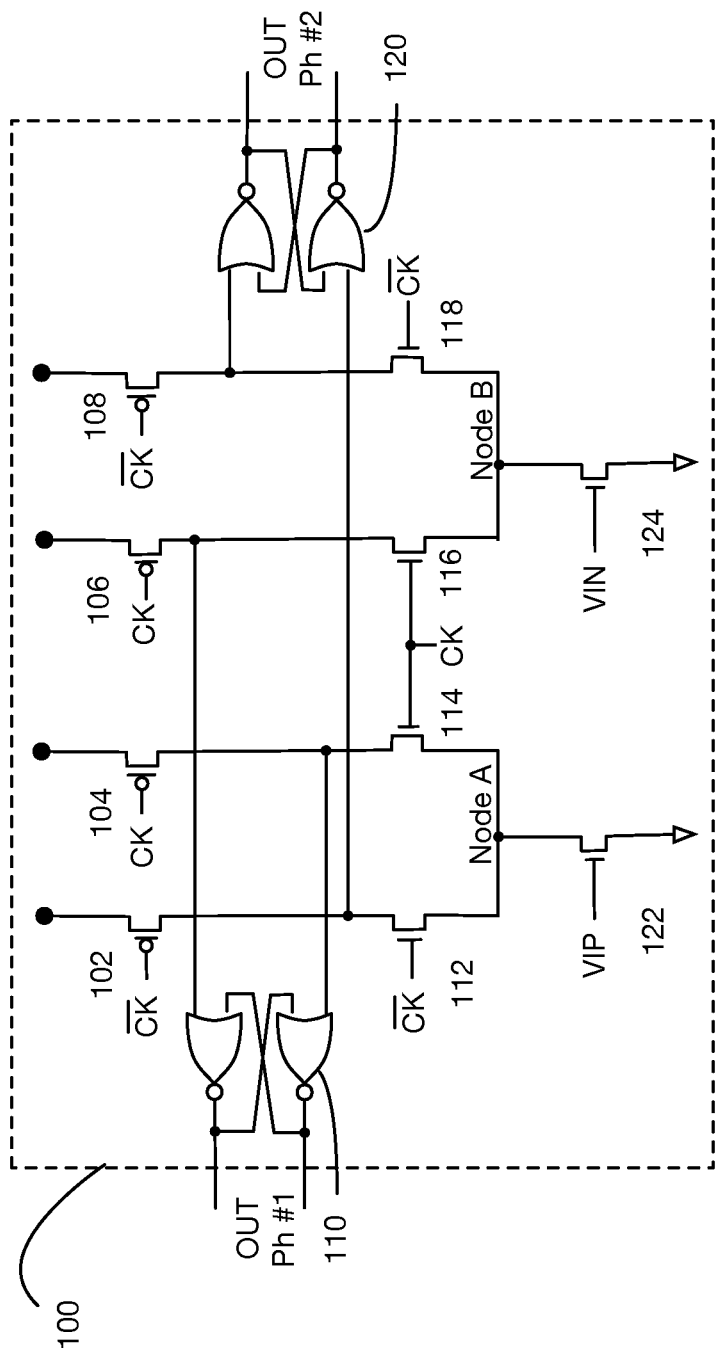
FIG. 1 is a schematic diagram of a clocked voltage sampler embodiment.

To reliably detect the data values transmitted over a communications system, a communications receiver accurately measures its received signal value amplitudes at carefully selected times, typically at or near the center of that received signal's period of stability between transitions. This point is commonly described as the "center of eye", (referring to the well-known "eye diagram" of signal amplitude vs. clock intervals) and is typically determined by use of a local "receive clock" which is configured to occur at that desirable sampling time. Generation and ongoing control of such receive clock timing is well understood in the art, as Clock Data Alignment (CDA) systems measure and incrementally adjust sample timing versus receive signal stability time to optimize sample timing.

In some embodiments, the value of the received signal is first captured at the selected time using a sample-and-hold or track-and-hold circuit, and then the resulting value is measured against one or more reference values using a known voltage comparator circuit. In alternative embodiments, the signal amplitude is continuously measured using a voltage comparator, with the digital result then sampled in time using a clocked digital latch.

Other embodiments utilize circuits capable of applying both the time- and amplitude-domain constraints, producing a result that represents the input value at a particular time and relative to a provided reference level.

In particular, vector signaling codes of the type described in [Cronie I], [Cronie II], and [Shokrollahi II] may be efficiently decoded using so-called Multi-Input Comparators (MICs) as described in [Holden I] and [Tajalli I]. In one embodiment, each MIC performs an analog computation of the form $$\text{sign}(a_0{}^*x_0+\ldots+a_{m-1}{}^*x_{m-1}), \qquad \text{Eqn. 1}$$

where $(x_0, x_1, \ldots, x_{m-1})$ are the received vector signaling code values, and $a_0, a_1, \ldots, a_{m-1}$ are "weighting factors" associated with each input, and the sign function is defined as:

$$\text{sign}(x)=+1 \text{ if } x>0, \text{sign}(x)=-1 \text{ if } x<0, \text{ and sign}(x) \text{ is undefined if } x=0.$$

[Holden I] also teaches that Eqn. 1 may be efficiently embodied in a differential amplifier structure having multiple positive and multiple negative inputs, each such input structure representing one element of Eqn. 1. [Ulrich I] further teaches that the weighting factors in such input structures may be efficiently represented as scaled transistor dimensions in an integrated circuit embodiment, or alternatively as paralleled multiple transistor instances where the set of weighting factors may be represented as integer values.

In vector signaling code receivers, each subchannel is composed of a MIC performing the mixing or weighted summation operations for decoding a subchannel, sampling of the resulting output, followed by implementation-specific data processing. At high data rates, four or more phases of data processing may be implemented to keep up with the received symbol rate of the decoders, with each phase typically utilizing its own sampler.

Thus, a single received signal source may be measured by multiple sampling circuits, either to facilitate data reception at rates greater than a single data processing system can sustain, or to support ancillary functions such as clock synchronization, test/diagnostic support, etc. In these embodiments, energy leakage such as from clock switching within one sampler may appear as transients at the sampler input (herein described as "kickback"), which may then perturb other sampler measurements of the common input signal. Sampler embodiments are described that produce extremely low levels of kickback energy, making them particularly desirable in such applications.

Low Kickback Sampler

In many embodiments, a received signal source may be measured by multiple sampling circuits, either to facilitate data reception at rates greater than a single data processing system can sustain (so-called multiphase receiver architectures), or to support ancillary functions such as clock synchronization, test/diagnostic support, etc. In such embodiments, energy leakage such as from clock switching within one sampler may appear as transients at the sampler input (herein described as "kickback"), which may then perturb other sampler measurements of the common input signal. Sampler embodiments are described below that produce extremely low levels of kickback energy, making them particularly desirable in such applications.

FIG. 1 is a schematic diagram for a clocked sampler embodiment presenting extremely low kickback energy to its inputs. When CK is low, the center two discharging field-effect transistors (FETs) 114, 116 are off, and the two pre-charging PMOS FETs 104, 106 are turned on to charge the parasitic capacitance of 114 and 116 at the output nodes (drain terminals). With both of the output nodes charged, the inputs to the OR-gate latch 110 are both high voltages representing logic 1's, thereby causing both outputs of OUT Ph #1 to be lower voltage logic 0's. VIP (Vin+) and VIN (Vin−) are applied to tail current sources 122 124, respectively. Once CK goes high, the PMOS pre-charging FETs 104, 106 are turned off and the NMOS discharging FETs 114 116 are turned on. Depending on the polarity of Vin, VIP will be high or VIN will be high. Whichever one is high will cause either FET 122 or FET 124 to conduct current thereby discharging the respective output node of either FET 114 (if VIP is high) or FET 116 (if VIN is high). As the respective output node transitions to a logic 0, the corresponding NOR gate of latch 110 will transition to a logic 1. As an example, if VIP is high, FET 122 conducts current and discharges the drain output node of discharging FET 114, causing both inputs to the bottom NOR gate of latch 110 to be 0, causing its output to toggle to a 1, which also locks the top NOR gate of latch 110 to have a logic 0 output. Similarly, the FETs 112, 118, 102, 108 operate in the same way with latch 120, but with the timing associated with clock phase $\overline{CK}$. Further, the PMOS/NMOS configurations described above should not be considered limiting, and may be reversed in some embodiments.

Sampler 100 is inherently two-phased, controlled by complementary clocks CK and (CK)⁻, sampling differential signal inputs VIP and VIN and producing digital results OUTPh #1 and OUTPh #2. The circuit symmetry causes potential clock-related noise injection to be cancelled out, or to appear as less troublesome common-mode input disturbances. Because Node A and Node B are at virtual ground level and thus experience little voltage swing, they are relatively immune to noise induced via parasitic paths from the sampler output or clock inputs. As Nodes A and B experience a small amount of voltage swing due to the isolation from the output nodes, the amount of input kickback that is introduced into input signals VIP and VIN is reduced. Further, the Miller capacitance of the transistors associated with VIP and VIN inputs is extremely low and constant, further reducing input kickback.

One of inputs VIP and VIN may alternatively be used as a reference voltage input and the other as a single-ended received signal input.

Figure 5:
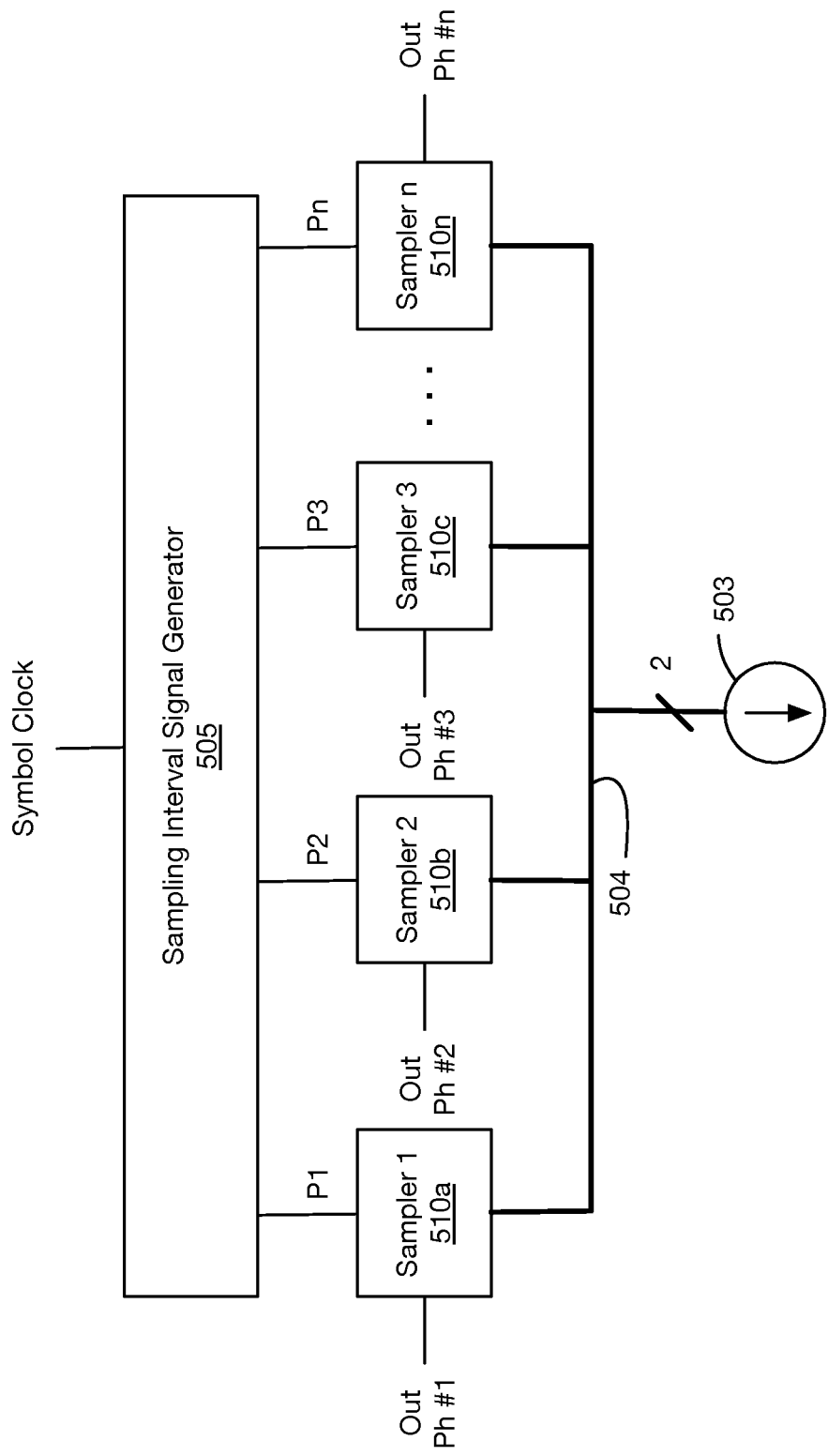
FIG. 5 is a block diagram of a multi-phase sampler with low input kickback, in accordance with some embodiments.

FIG. 5 illustrates a multi-phase sampler with low input kickback, in accordance with some embodiments. As shown, the multi-phase sampler includes a differential current generator 503 configured to receive a signal to be sampled, and to responsively generate, at a pair of common nodes 504, a differential current representative of the received signal. The apparatus further includes a sampling interval signal generator 505 configured to receive a symbol clock and to responsively generate the sampling interval signals P1, P2, . . . Pn on a plurality of sampling interval phase outputs. The apparatus further includes a plurality of samplers 510a/510b/ . . . /510n, each sampler connected to the pair of common nodes 504. In some embodiments, each sampler includes a pre-charging FET pair having a control input connected to one of the plurality of sampling interval phase outputs to pre-charge a pair of output nodes. Further, each sampler may include a FET pair, each FET of the FET pair connected to a corresponding common node of the pair of common nodes, the FET pair having a control input connected to one of the plurality of sampling interval phase outputs and configured to selectively enable the differential current to discharge the pair of output nodes, forming a differential output voltage. The sampler further includes a latch connected to the output nodes of the FET pair, the latch configured to latch the differential output voltage to form outputs Out Ph #1, etc.

Referring to the example given in FIG. 1, it may be observed the schematic of FIG. 1 includes 2 samplers. The first sampler includes pre-charging FET pair 104/106 connected to sampling interval signal CK, and includes discharging FET pair 114/116 connected to sampling interval signal CK to discharge the output nodes connected to latch 110 using differential current generator composed of current sources 122 and 124 receiving the signal to be sampled VIN/VIP. Similarly, FIG. 1 includes a second sampler receiving sampling interval signal CK, the second sampler composed of pre-charging FET pair 102/108, FET pair 112/118, and latch 120.

Figure 4:
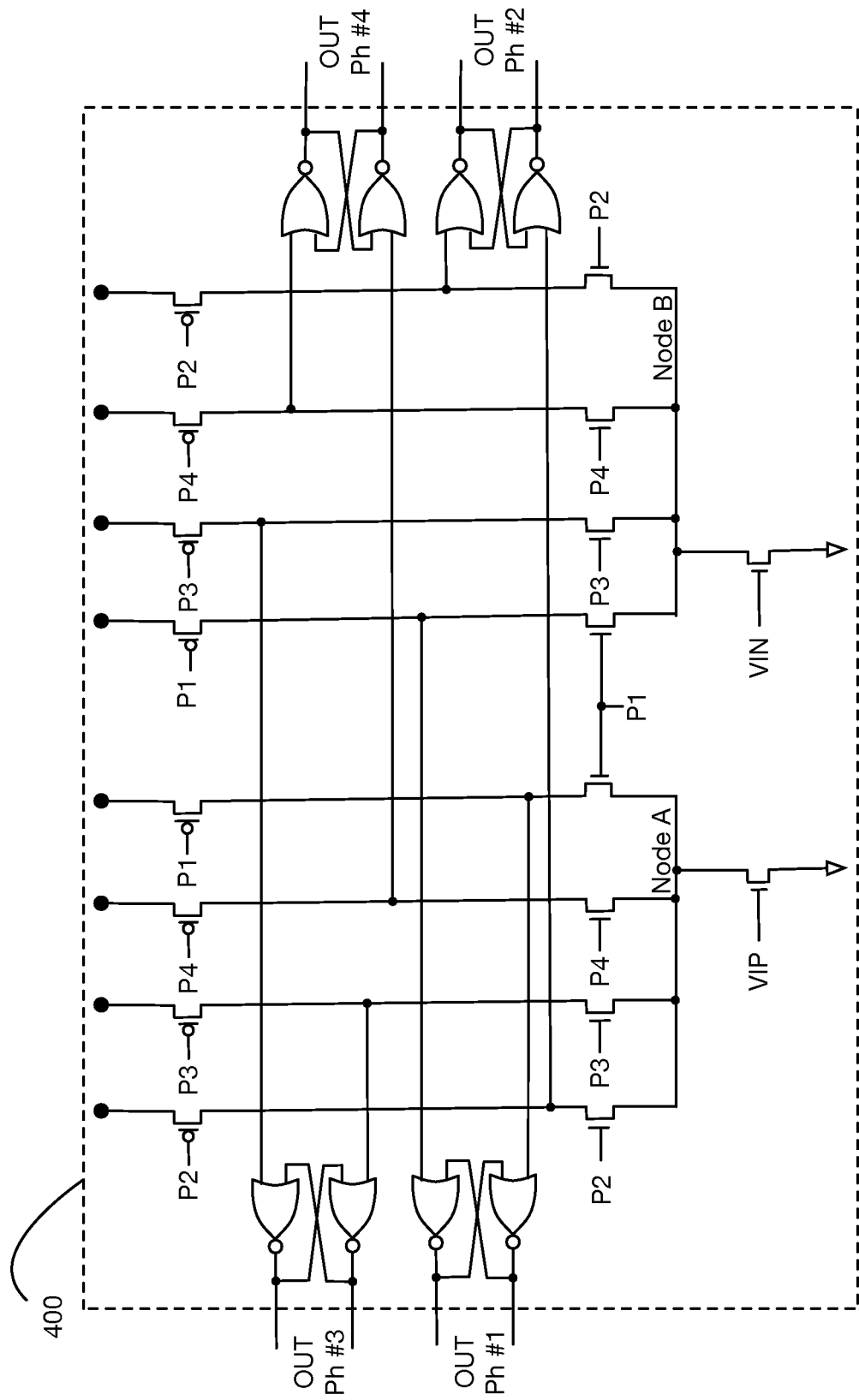
FIG. 4 is a schematic diagram of another clocked voltage sampler embodiment.

The described architecture may be extended to support additional sampling phases within the same sampling circuit. FIG. 4 is a schematic diagram of another embodiment, in which the two phase transistor elements of 100 connecting to Node A and Node B in FIG. 1 are replicated. In the resulting four phase clocked sampler embodiment 400, clock phases P1, P2, P3, and P4 are four non-overlapping clock phases, each controlling the sample timing for respective differential outputs OUT Ph #1, OUT Ph #2, OUT Ph #3, OUT Ph #4. Other numbers of sampling phases may be supported by similarly replicating the appropriate number of transistor structures as illustrated by these examples.

Figure 6A:
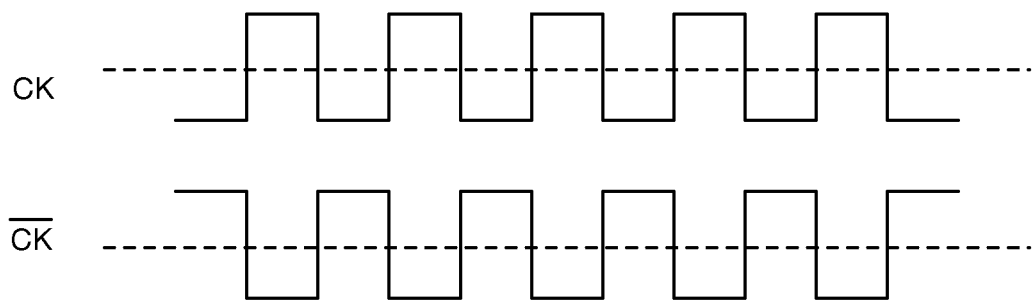
FIGS. 6A and 6B are timing diagrams depicting sampling interval signals, in accordance with some embodiments.
Figure 6B:
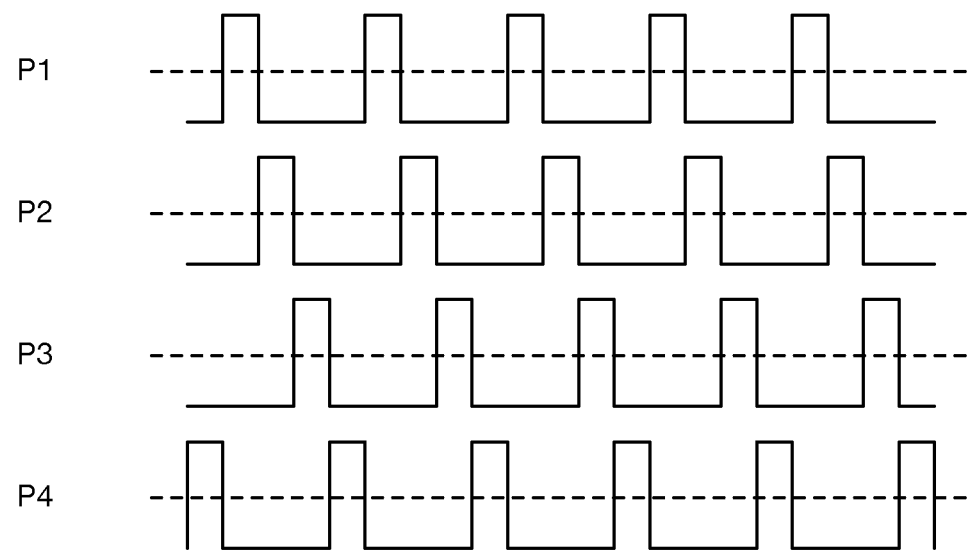

FIGS. 6A and 6B illustrate timing diagrams for sampling interval signals, in accordance with some embodiments. As shown, FIG. 6A illustrates sampling interval signals CK and $\overline{CK}$, in accordance with FIG. 1. As shown, sampling interval signals CK and $\overline{CK}$ are clock signals having a 50% duty cycle and a 180-degree phase difference, and are non-overlapping. FIG. 6B illustrates a set of four sampling interval signals P1/P2/P3/P4 in accordance with FIG. 4. As shown, each sampling interval signal P1/P2/P3/P4 has a duty cycle of 25% and are thus non overlapping. In some embodiments, for a given number of phases n, a duty cycle of each sampling interval may be $$\frac{1}{n} \cdot 100\%.$$

In some embodiments, the sampling interval signal generator may operate on a received symbol clock, which may be received on separate wires of the multi-wire bus, embedded in a sub-channel in orthogonal encoding embodiments, derived from signal transitions on the multi-wire bus, or various other ways of clock data recovery (CDR). In some embodiments, the symbol clock may be used directly, as in FIG. 6A, while alternative embodiments may generate non-overlapping signals such as the sampling interval signals P1/P2/P3/P4 in FIG. 6B.

Figure 7:
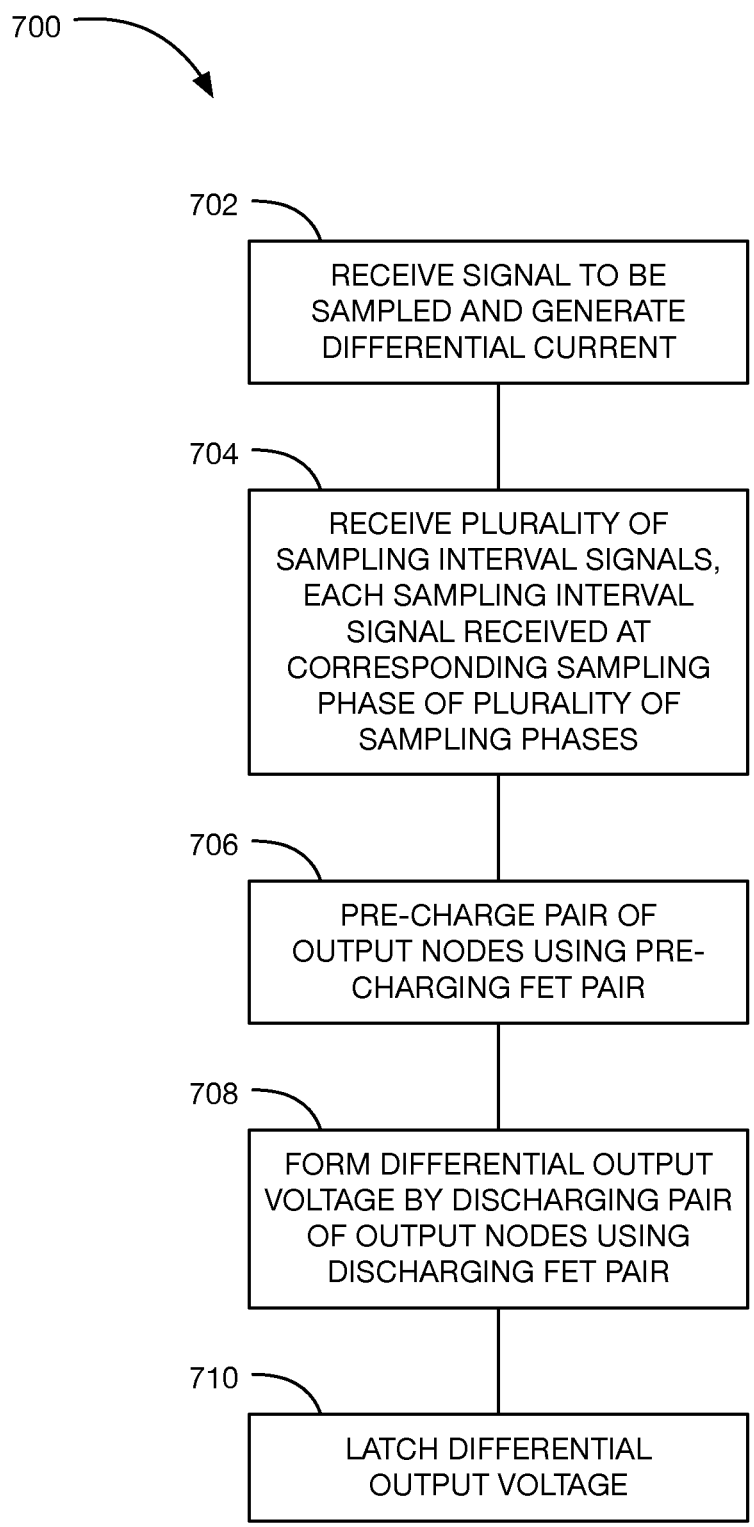
FIG. 7 is a flowchart of a method, in accordance with some embodiments.

FIG. 7 depicts a flowchart of a method 700, in accordance with some embodiments. As shown, method 700 begins at step 702 by receiving a signal to be sampled and responsively generating, at a pair of common nodes, a differential current representative of the received signal. Further, a plurality of sampling interval signals is received 704, each sampling interval signal received at a corresponding sampling phase of a plurality of sampling phases. For example, as shown in FIG. 1, the sampling phase OUT Ph #1 receives sampling interval signal CK, while sampling phase OUT Ph #2 receives sampling interval signal $\overline{CK}$. For each sampling phase, a corresponding pair of output nodes are pre-charged 706 using a pre-charging FET pair receiving the sampling interval signal. In FIG. 1, a pre-charging FET pair may include FETs 104 and 106. A differential output voltage is formed 708 by discharging the corresponding pair of output nodes via a discharging FET pair, such as FET pair 114/116 connected to the pair of common nodes, the FET pair receiving the sampling interval signal and selectively enabling the differential current to discharge the corresponding pair of output nodes. Lastly, the differential output voltage is latched 710, for instance using SR latch 110.

Figure 3A:
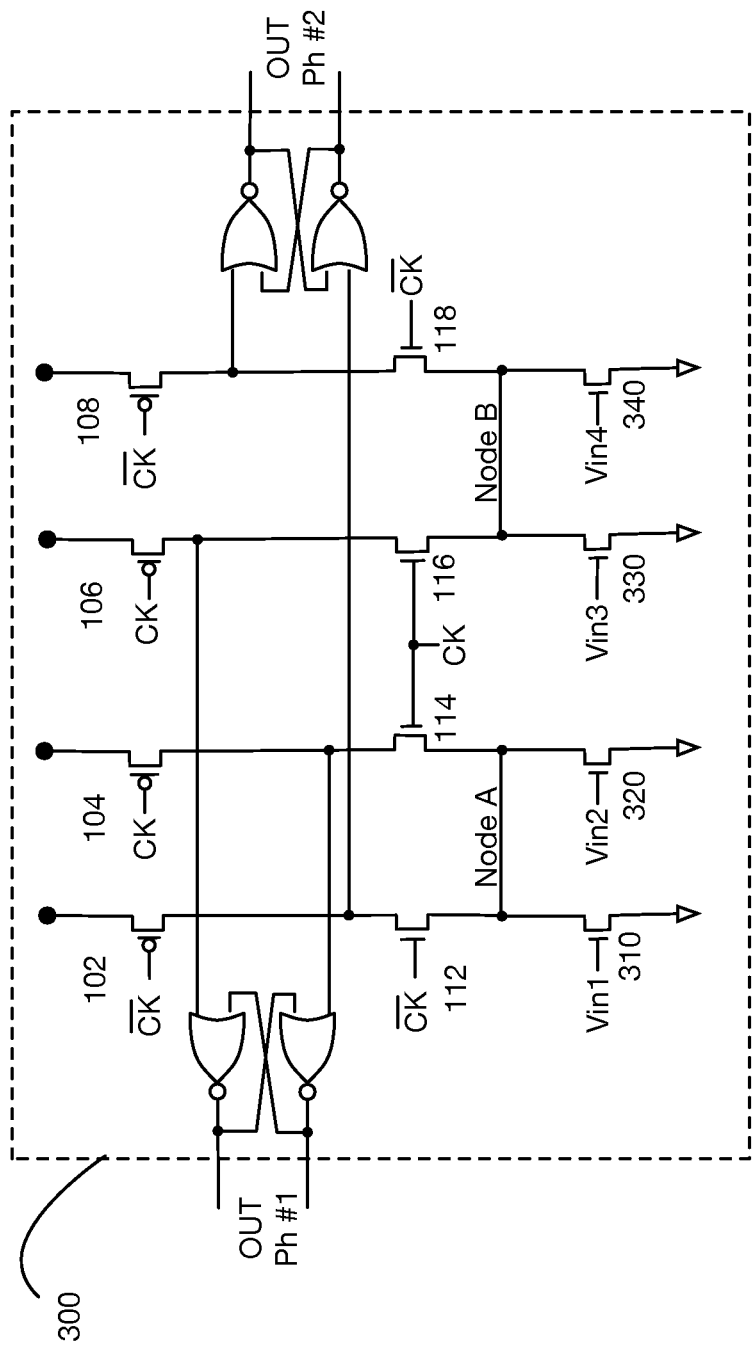
FIGS. 3A, 3B, and 3C are schematic diagrams of a clocked voltage sampler embodiment further comprising linear decoding of a vector signaling code, in accordance with some embodiments.
Figure 3B:
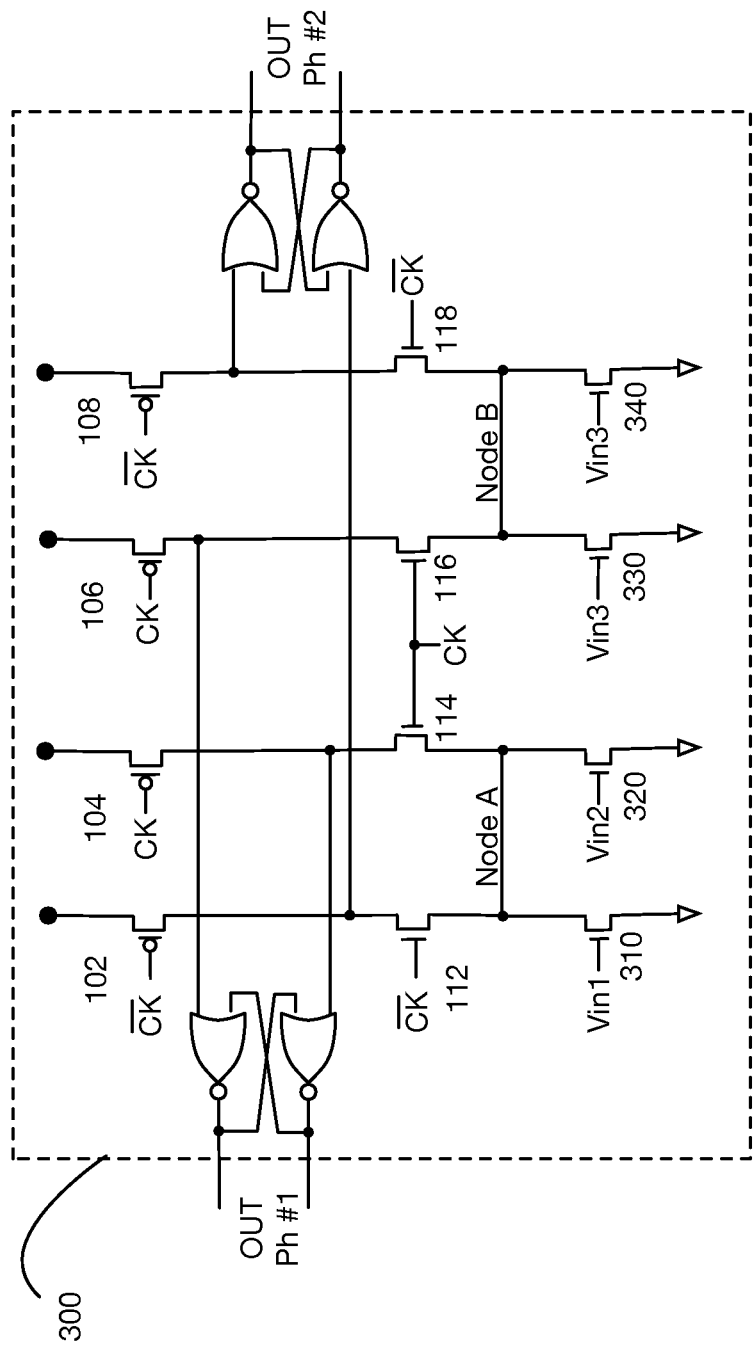
Figure 3C:
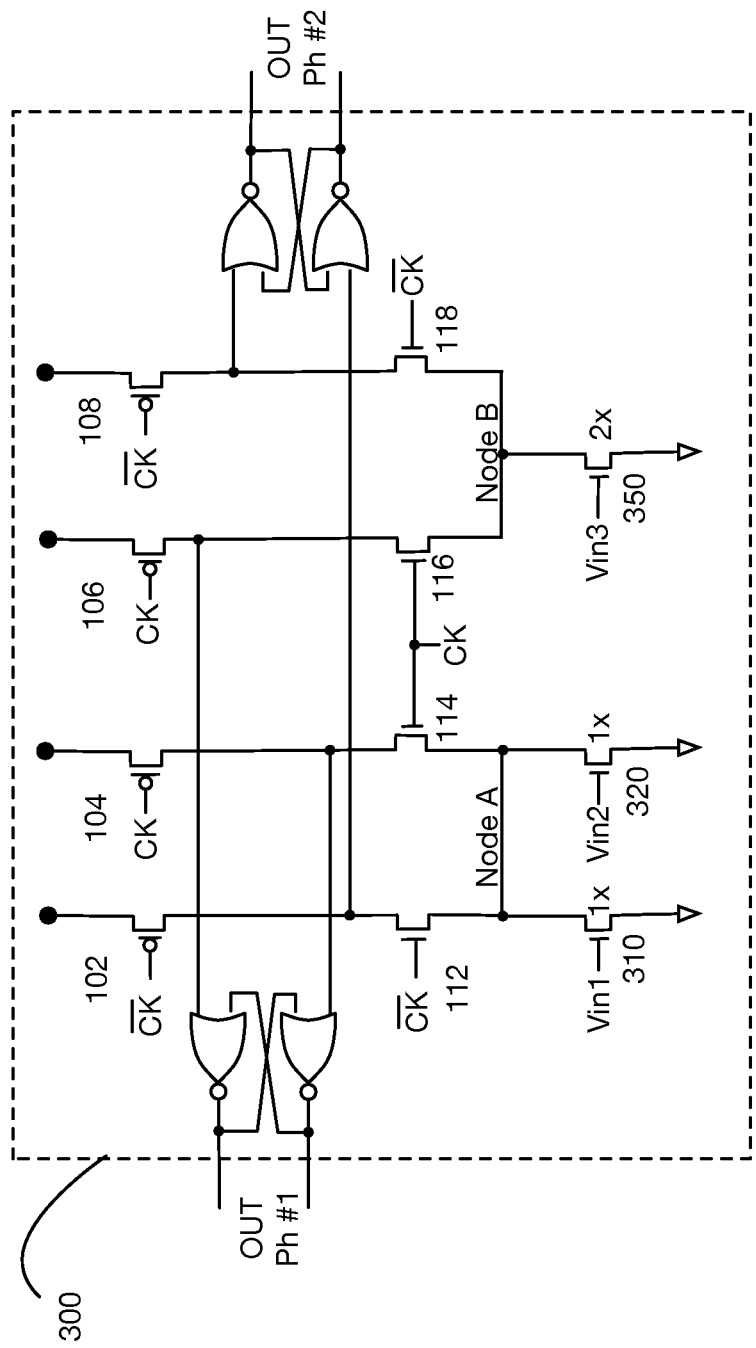

In some embodiments, the received signal to be sampled is a differential input signal, such as VIN/VIP shown in FIG. 1. Alternatively, the received signal to be sampled comprises a plurality of signal components corresponding to symbols of a codeword of a vector signaling code, such as signal components Vin1/Vin2/Vin3/Vin4 shown in FIG. 3A. In some embodiments, generating the differential current comprises forming linear combinations of the signal components of the received signal to be sampled. FIGS. 3A-3C illustrate such circuits for forming linear combinations. Specifically, FIG. 3A illustrates the linear combination of (Vin1+Vin2)−(Vin3+Vin4). In such embodiments, the linear combinations are formed using a plurality of current sources. In some embodiments, the plurality of current sources each have equal magnitude, as shown in FIG. 3A and FIG. 3B. Alternatively, a first current source of the plurality of current sources has a magnitude larger than a second current source of the plurality of current sources. Such an embodiment is illustrated by FIG. 3C, where current source depicted by 350 has a magnitude 2× that of current sources depicted by transistors 310 and 320, each having magnitude 1×.

In some embodiments, the pair of common nodes are virtual ground for isolating the received signal to be sampled from the pair of output nodes.

Figure 2:
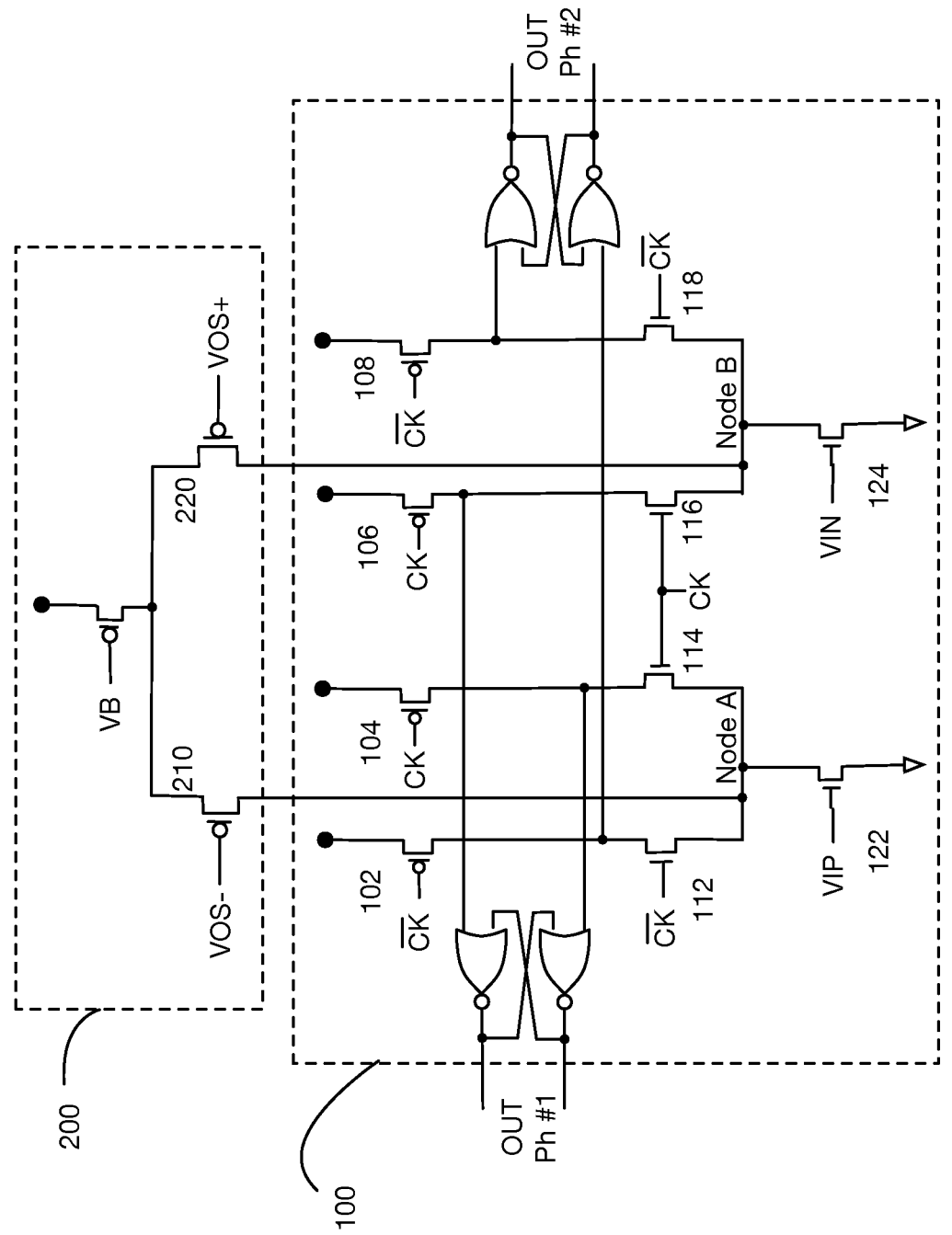
FIG. 2 is a schematic diagram of a clocked voltage sampler embodiment further comprising an offset voltage compensator.

In some embodiments, the method further includes injecting an offset voltage into the pair of common nodes, as shown for example in FIG. 2.

In some embodiments, the plurality of sampling interval signals are non-overlapping, as shown in FIGS. 6A and 6B.

Offset Voltage Compensation

FIG. 2 is a schematic diagram of an embodiment combining the clocked voltage sampler of FIG. 1 with an offset voltage compensation circuit. As shown, offset voltage compensation circuit takes the form of a differential offset FET pair 210/220. Sampler 100 is effectively identical to the circuit of FIG. 1, with offset voltage compensator 200 injecting corrective voltages VOS+ and VOS− into the pair of common nodes of 100 at Node A and Node B. Voltage VB provides bias current for the offset voltage compensator 200, and should be selected such that the PMOS side current does not exceed the NMOS side current within 200. VB also has a secondary control effect on sampler gain, with low PMOS current relative to NMOS current in 200 correlating with low gain in 100, and similar PMOS and NMOS currents in 200 correlating with higher gain in 100.

The use of a single offset voltage correction circuit 200 for a single sampler 100 providing results to two processing phases results in a lower power utilization for the overall sampler system, compared to known art methods requiring one correction circuit per sampler per processing phase.

The corrective voltages may be used to adjust circuit parameters, such as to compensate for circuit imbalance caused by component mismatch or drift. Alternatively, in at least one embodiment the corrective voltages comprise signal measurement thresholds intentionally introduced to control the switching point for sampler output results. In a further embodiment the corrective voltages comprise communications network compensation values, such as produced by a Decision Feedback Compensation (DFE) system.

Combined Linear Decoder and Sampler

The clocked voltage sampler of FIG. 1 may also be combined with the functionality of a Multi-input comparator (MIC) to produce a single circuit that mixes (i.e. decodes) a vector signaling code input and samples the decoded result. FIG. 3A is a schematic diagram of one such embodiment, in which multiple paralleled input transistors 310, 320, 330, 340 accepting signal components of the received signal to be sampled, shown as vector signaling code inputs Vin1, Vin2, Vin3, and Vin4 respectively. A linear combination of the signal components may be formed to form an output. As shown in FIG. 3A, the linear combination is represented by the equation (Vin1+Vin2)−(Vin3+Vin4). Further, additional paralleled transistors may be attached to Node A and/or Node B, either to support additional inputs, or to provide integer ratio weighting functions for particular inputs, as taught in [Holden I], [Ulrich I], and [Tajalli I]. FIG. 3B is a schematic diagram illustrating the use of transistors 330 and 340 both accepting Vin3 to apply a weight of 2 to Vin 3, while Vin1 and Vin2 each have weights of 1. As such, the linear combination performed by the circuit of FIG. 3B is (Vin1+Vin2)−(2·Vin3). In some embodiments, a sum of weights connected to each Node A and Node B is equal, representing a balanced condition. FIG. 3C illustrates a further embodiment utilizing weighting, in which transistors 330 and 340, each having weights of 1, are replaced by a single transistor 350 receiving Vin3 and having a weight of 2. In such embodiments, transistor 350 may have different characteristics than transistors 310 and 320 applying weights of 1 to Vin1 and Vin2, respectively. Such characteristics may include differing transistor width/length, for instance. Similar to FIG. 3B, the circuit depicted by FIG. 3C represents the linear combination of (Vin1+Vin2)−(2·Vin3). In some embodiments, 300 may be combined with 200 of FIG. 2 to inject offset voltage corrections into Node A and Node B, e.g. to support DFE correction.

It should be noted that the term "circuit" may mean, among other things, a single component or a multiplicity of components, which are active and/or passive, and which are coupled together to provide or perform a desired function. The term "circuitry" may mean, among other things, a circuit, a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays.

It should be further noted that the various circuits and circuitry disclosed herein may be described using computer aided design tools and expressed (or represented), as data and/or instructions embodied in various computer-readable media, for example, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). The embodiments described are also directed to such representation of the circuitry described herein, and/or techniques implemented thereby, and, as such, are intended to fall within the scope of the present embodiments.

Moreover, the various circuits and circuitry, as well as techniques, disclosed herein may be represented via simulations and simulation instruction-based expressions using computer aided design, simulation and/or testing tools. The simulation of the circuitry described herein, and/or techniques implemented thereby, may be implemented by a computer system wherein characteristics and operations of such circuitry, and techniques implemented thereby, are simulated, imitated, replicated, analyzed and/or predicted via a computer system. Simulations and testing of the devices and/or circuitry described herein, and/or techniques implemented thereby, and, as such, are intended to fall within the scope of the present embodiments. The computer-readable media and data corresponding to such simulations and/or testing tools are also intended to fall within the scope of the present embodiments.

I claim:

1. An apparatus comprising:
a pre-charging field-effect transistor (FET) pair having a control input connected to a sampling interval phase output for receiving a sampling interval signal, the pre-charging FET pair configured to set an amount of charge on a pair of output nodes;
a differential current generator configured to receive a signal to be sampled and to responsively generate a differential current representative of the received signal;
a sampling FET pair connected between the pair of output nodes and the differential current generator to isolate the received signal from the pair of output nodes, the sampling FET pair having a control input connected to the sampling interval phase output to selectively enable the differential current to form a differential output voltage on the pair of output nodes; and
a latch connected to the pair of output nodes, the latch configured to latch the differential output voltage.

2. The apparatus of claim 1, further comprising a sampling interval signal generator configured to obtain a symbol clock and to responsively generate the sampling interval signal on the sampling interval phase output.

3. The apparatus of claim 2, wherein the sampling interval signal generator is configured to generate a plurality of sampling interval signals on a plurality of sampling interval phase outputs.

4. The apparatus of claim 3, wherein the plurality of sampling interval signals comprises n sampling interval signals, wherein n is an integer greater than one, each sampling interval signal of the n sampling interval signals having a duty cycle of $$\frac{1}{n} \cdot 100\%.$$

5. The apparatus of claim 2, wherein the sampling interval signal generator is configured to obtain the symbol clock via a respective pair of wires.

6. The apparatus of claim 2, wherein the symbol clock is embedded in a sub-channel of an orthogonal code.

7. The apparatus of claim 2, wherein the symbol clock is derived from signal transitions on a multi-wire bus.

8. The apparatus of claim 1, wherein the differential current generator is configured to receive a set of at least three signals corresponding to symbols of a codeword of a vector signaling code.

9. The apparatus of claim 8, wherein the differential current generator is configured to generate at least one current of the differential current by forming an analog summation of partial currents generated from at least two signals of the set of at least three signals.

10. The apparatus of claim 1, further comprising an offset voltage compensation circuit connected in parallel with the differential current generator, the offset voltage compensation circuit configured to inject an offset voltage into the pair of output nodes.

11. A method comprising:
setting an amount of charge on a pair of output nodes using a pre-charging field-effect transistor (FET) pair having a control input connected to a sampling interval phase output for receiving a sampling interval signal;
receiving a signal to be sampled at a differential current generator and responsively generating a differential current representative of the received signal;
selectively enabling the differential current to form a differential output voltage on the pair of output nodes using a sampling FET pair connected between the pair of output nodes and the differential current generator to isolate the received signal from the pair of output nodes, the sampling FET pair having a control input connected to the sampling interval phase output; and
latching the differential output voltage using a latch connected to the pair of output nodes.

12. The method of claim 11, further generating the sampling interval signal on the sampling interval phase output based on an obtained symbol clock.

13. The method of claim 12, further comprising generating a plurality of sampling interval signals on a plurality of sampling interval phase outputs based on the obtained symbol clock.

14. The method of claim 13, wherein the plurality of sampling interval signals comprises n sampling interval signals, wherein n is an integer greater than one, each sampling interval signal of the n sampling interval signals having a duty cycle of $$\frac{1}{n} \cdot 100\%.$$

15. The method of claim 12, wherein the symbol clock is obtained via a respective pair of wires.

16. The method of claim 12, wherein the symbol clock is embedded in a sub-channel of an orthogonal code.

17. The method of claim 12, wherein the symbol clock is derived from signal transitions on a multi-wire bus.

18. The method of claim 11, wherein the signal to be sampled corresponds to a set of at least three signals corresponding to symbols of a codeword of a vector signaling code.

19. The method of claim 18, wherein generating the differential current comprises forming an analog summation of partial currents generated from at least two signals of the set of at least three signals.

20. The method of claim 11, further comprising injecting an offset voltage into the pair of output nodes.

* * * * *